United States Patent [19]
Conkle

[11] Patent Number: 5,666,322
[45] Date of Patent: Sep. 9, 1997

[54] PHASE-LOCKED LOOP TIMING CONTROLLER IN AN INTEGRATED CIRCUIT MEMORY

[75] Inventor: Cecil W. Conkle, Palo Alto, Calif.

[73] Assignee: NEC Electronics, Inc., Mountain View, Calif.

[21] Appl. No.: 531,744

[22] Filed: Sep. 21, 1995

[51] Int. Cl.⁶ .................................................. G11C 8/00
[52] U.S. Cl. ............... 365/233; 365/194; 365/230.03; 327/147
[58] Field of Search .................... 365/233, 230.03; 327/147, 148, 149, 156, 157, 158

[56] References Cited

U.S. PATENT DOCUMENTS

| | | | |
|---|---|---|---|
| 4,654,864 | 3/1987 | Ichiyoshi | 375/120 |
| 5,440,515 | 8/1995 | Chang et al. | 365/194 |
| 5,452,324 | 9/1995 | Lewis et al. | 375/373 |
| 5,475,718 | 12/1995 | Rosenkranz | 375/376 |
| 5,539,344 | 7/1996 | Hatakenaka | 327/147 |

*Primary Examiner*—David C. Nelms
*Assistant Examiner*—Hien Nguyen
*Attorney, Agent, or Firm*—Skjerven, Morrill, MacPherson, Franklin & Friel, L.L.P.

[57] ABSTRACT

Interleaved operation of multiple memory banks is improved by including a frequency multiplier and a synchronizing circuit, such as a phase-locked loop, as part of an integrated circuit memory chip. Frequency multiplication supplies additional clock edges for timing different phases of the system clock signal. The synchronizing circuit provide precise control of clock edge timing to exactly align the timing signals in one memory chip with the timing signals in another memory chip despite variability in temperature, process and voltage parameters between the chips.

31 Claims, 10 Drawing Sheets

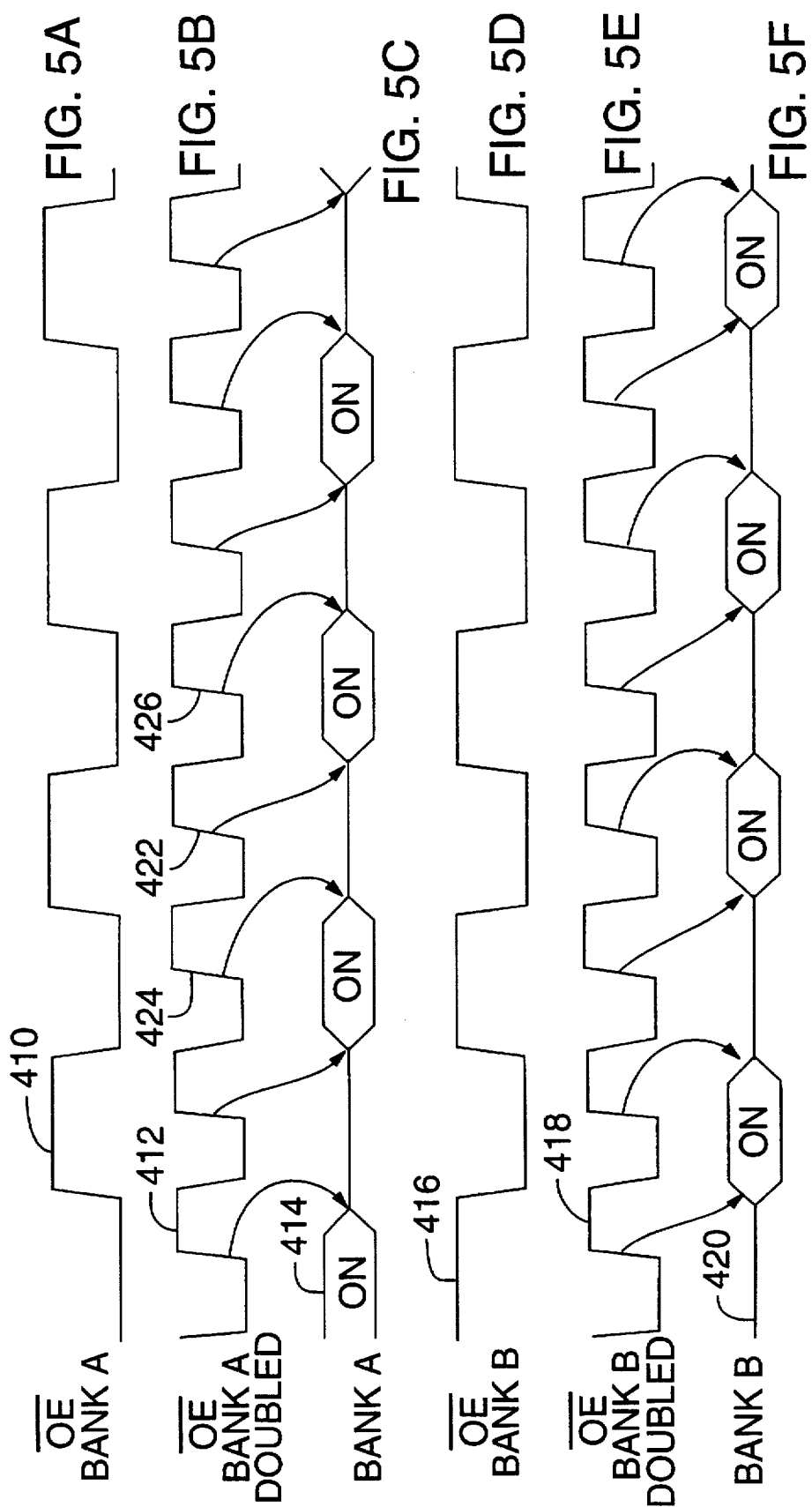

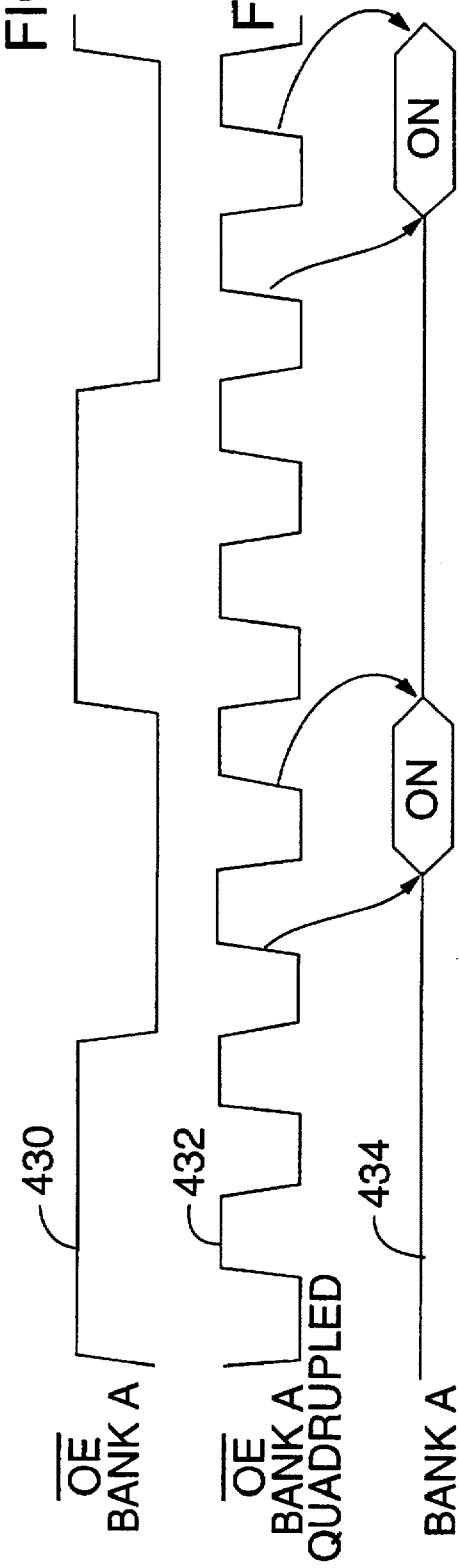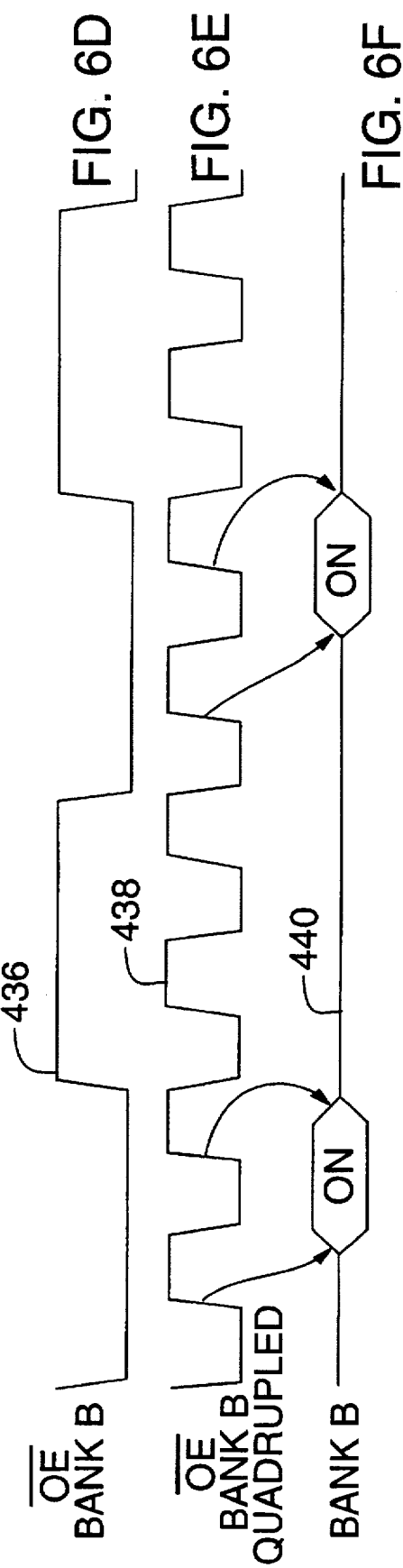

PHASE-LOCKED LOOP TIMING CONTROLLER IN AN INTEGRATED CIRCUIT MEMORY

BACKGROUND OF THE INVENTION

1. Field of the Invention

The present invention relates to a integrated circuit memories, and more particularly to an integrated circuit memory which includes frequency multiplier and clock edge synchronizing circuit to prevent bus contention during memory bank switching operation.

2. Description of the Related Art

Computer systems commonly utilize a high performance microprocessor which accesses data in a memory. Typically, the microprocessor handles data at a much faster speed than the memory. A common technique for better utilizing the speed of the microprocessor is to furnish two memory banks connected to a shared data bus and to interleave data access operations between the two banks. However, by accessing the multiple memory banks in this manner, contention for the bus between the memory banks may occur, in which two memory banks attempt to drive data of opposite levels on the same common data line.

Contention occurs when one memory bank is not completely deactivated, holding its output in a low impedance state, before another bank is activated. Bus contention often results because one memory bank is simply faster than another bank. Typically, separate memory chips form respective memory banks in a structure which exacerbates the problem of bus contention since temperature, process and voltage variability between the chips leads to variability in the operating speeds of memory in the different banks. In fact, even timing of clock signals within a single bank can vary widely depending on process conditions.

An example of a bus contention condition is shown in FIGS. 1A, 1B and 1C in which FIG. 1A depicts the signals 10 and 12 on output enable lines that drive respective memory banks A and B. FIGS. 1B and 1C illustrate, in a highly schematic manner, respective data signals 20 and 30 generated by the output drivers of memory banks A and B. In FIG. 1B, point 22 illustrates the earliest time at which memory bank A is deactivated after activation, point 24 illustrates the latest time. Time interval 26 depicts the variation in memory bank deactivation time of memory bank A due to differences in voltage, temperature and silicon processing. In FIG. 1C, point 32 illustrates the earliest time at which memory bank B is activated after deactivation, point 34 illustrates the latest time. Time interval 36 depicts the variation in memory bank activation time of bank B due to differences in voltage, temperature and silicon processing. Performance of the memory circuits depends on the timing relationships of points 22, 24, 32 and 34. If memory bank A is deactivated long before bank B is activated, reliable bank switching occurs but speed performance is limited. If memory bank A is deactivated shortly before bank B is activated, reliable bank switching occurs and speed performance is enhanced. However, if memory bank A is deactivated after bank B is activated, both banks are simultaneously activated and operation of memory switching becomes unreliable.

FIG. 2, which illustrates the effect on the memory circuit when both memory banks A and B are simultaneously active, shows a final stage of an output driver 50 of memory bank A and a final stage of an output driver 60 of memory bank B, each of which has an output terminal connected to a common data line 80. The common data line 80, which is typically a metal trace on a PC board, is connected to bonding wire for communications outside the computer system. In memory bank A, pullup transistor 52 and pulldown transistor 54 are large transistors which draw a large current. Similarly, in memory bank B, pullup transistor 62 and pulldown transistor 64 are large transistors. If timing signals overlap so that memory banks A and B are activated at the same time, a condition can arise in which pullup transistor 62 of memory bank B is conductive while pulldown transistor 54 of memory bank A is conductive. Pullup transistor 52 of bank A and pulldown transistor 64 of bank B are not conductive. Under these conditions, a current path is formed from the power supply 70 of memory bank B through pullup transistor 62 out to the PC board and on to memory bank A pulldown transistor 54 to ground 72 inside bank A. A huge current spike is thus generated which causes a large noise spike but also can damage an integrated circuit chip if the current spike is sufficiently large and enduring.

Data line contention is thus a timing overlap difficulty which generates noise in the form of large, transient current spikes. Large current transients affect power supply and ground lines of the computer system to further create noise. Noise degrades the long term reliability of the memory banks connected to the data lines. Therefore a new approach is necessary to improve the accuracy of memory timing signals and to thereby improve noise performance.

SUMMARY OF THE INVENTION

The present invention is a memory interface control circuit that advantageously uses frequency multiplication and phase-locking to precisely control activation and deactivation times of multiple memory banks to prevent bus contention despite variability in temperature, power supply voltage and device fabrication processing conditions among the banks.

The present invention improves accuracy of memory access by avoiding the simultaneous driving of a common data bus by more than one memory bank.

Thus in accordance with the present invention, interleaved operation of multiple memory banks is improved by including a frequency multiplier and a synchronizing circuit, such as a phase-locked loop, as part of an integrated circuit memory chip. Frequency multiplication supplies additional clock edges for timing different phases of the system clock signal. The synchronizing circuit provides precise control of clock edge timing to exactly align the timing signals in one memory chip with the timing signals in another memory chip despite variability in temperature, process and voltage parameters between the chips.

In accordance with the present invention, one clock signal is supplied to multiple memory banks, each bank in a separate integrated circuit memory chip. An integrated circuit memory chip includes a frequency multiplier and timing synchronizing circuit, such as a phase-locked loop, so that multiple clock edges are provided internal to the memory chip and the timing or phase of the multiple clock edges is precisely the same for the multiple memory chips. The synchronizing circuit generates internal, well-controlled extra timing edges that are not supplied by the oscillator of the computer system, external to the memory chips.

In accordance with one embodiment of the present invention, an integrated circuit memory includes a memory array, an input/output circuit connected to the memory by a plurality of internal data lines, a decoding circuit connected to the memory array and to the input/output circuit by a plurality of address lines, and a control circuit connected to the input/output circuit by a control line and connected to an internal clock line. The integrated circuit memory also includes a timing circuit connected to the internal clock line and connected to an external signal clock line. The timing circuit includes a clock multiplier and clock edge synchronizing circuit having an input terminal connected to the external signal clock line and having an output terminal connected to the internal clock line.

Inclusion of clock frequency multiplication and clock synchronizing circuits in an integrated circuit memory chip has several advantages. One advantage is that the circuits compress system timing to make the computer system operate faster while improving reliability and generating less noise.

BRIEF DESCRIPTION OF THE DRAWINGS

The present invention may be better understood and its advantages, objects and features made better apparent by making reference to the following description, taken in conjunction with the accompanying drawings.

FIGS. 5A, 5B, 5C, 5D, 5E and 5F illustrate timing diagrams showing a clock frequency which is doubled for interleaving of data access between two memory banks in a computer system in which timing is controlled using output enable lines.

FIGS. 6A, 6B, 6C, 6D, 6E and 6F illustrate timing diagrams showing a clock frequency which is quadrupled for interleaving of data access between two memory banks in a computer system in which timing is controlled using output enable lines.

DETAILED DESCRIPTION

Figure 1A:
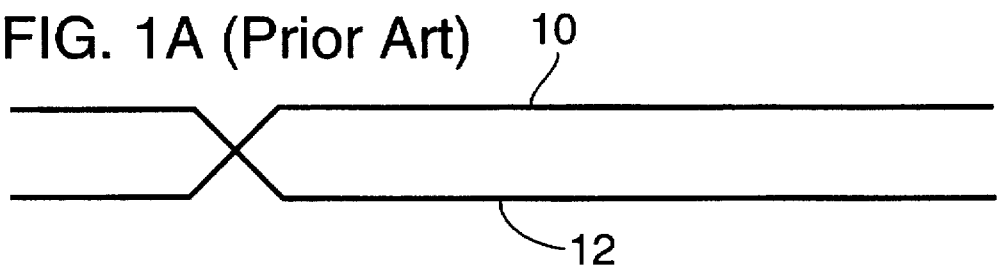
FIGS. 1A, 1B and 1C are timing diagrams which illustrate memory timing signals in accordance with a typical prior art technique utilized by a processor for driving two memory banks.
Figure 1B:
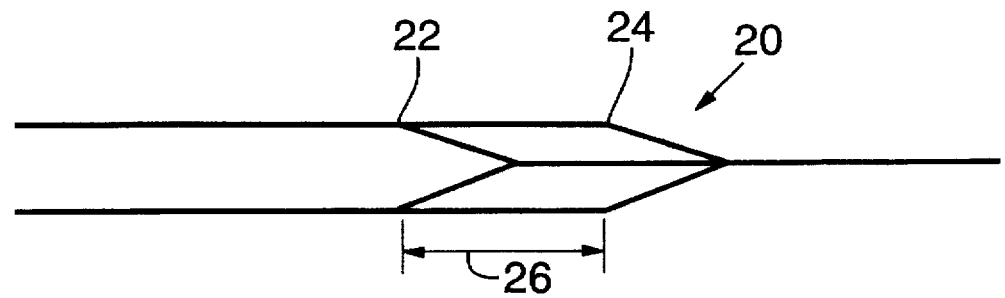
Figure 1C:
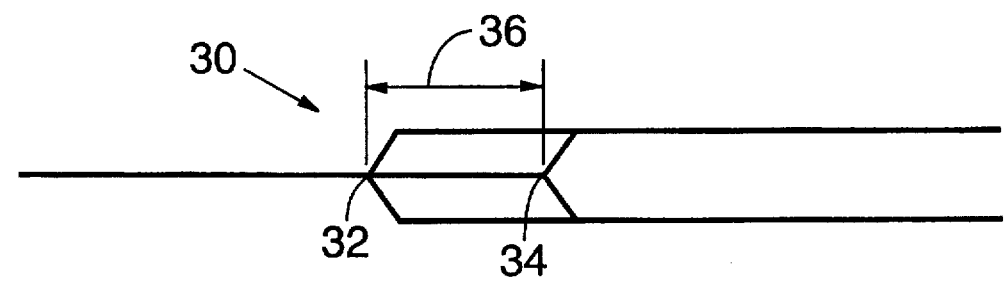
Figure 2:
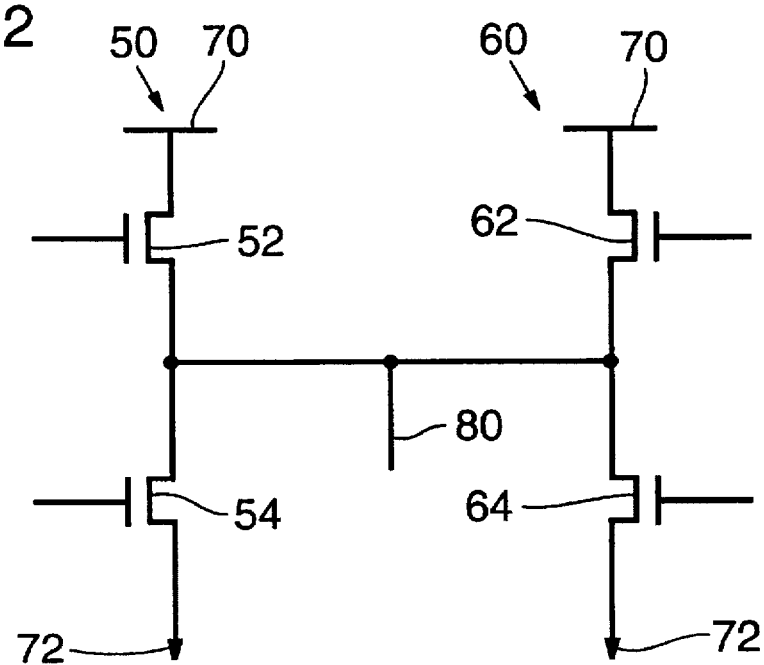
FIG. 2 illustrates output drivers for two memory banks which are mutually connected to an output data line.
Figure 3:
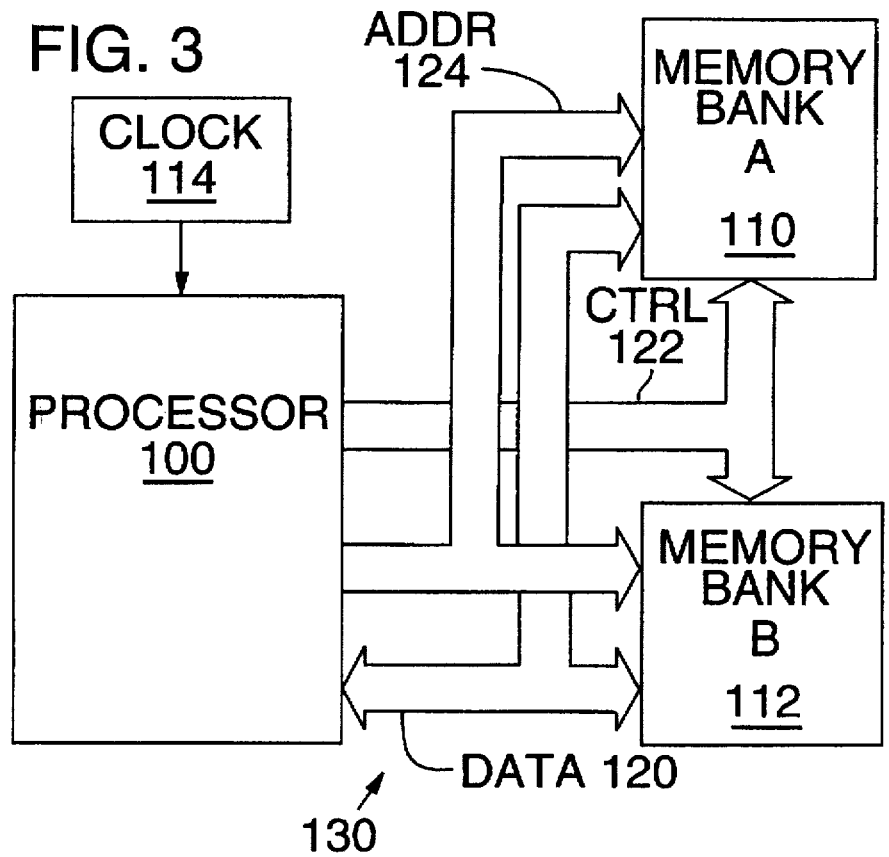
FIG. 3 illustrates a computer system connected to a pair of memory integrated circuit chips in accordance with the present invention.

Referring to FIG. 3, a computer system 130 includes a microprocessor 100, a clock circuit 114, a first memory bank A 110 in the form of a first memory integrated circuit chip and a second memory bank B 112 in the form of a second memory integrated circuit chip. The computer system 130 also includes a data bus 120 which is connected to both memory bank integrated circuits 110 and 112 so that access to the data bus is shared between the memory integrated circuits. An address bus 124 and a control bus 122 communicate address and bus information from the microprocessor 100 to the memory bank integrated circuits 110 and 112.

Each of the integrated circuit memory banks 110 and 112 includes an input terminal connected to the control bus 122. Microprocessor 100 is clocked by the clock 114. A line of the control bus 122 is a clock line (not shown) which carries a timing signal that the microprocessor 100 derives from a signal from clock 114. Each memory bank integrated circuit 110 and 112 includes an internal timing circuit (not shown) which is connected to the clock line from the control bus 122. Each of the timing circuits multiplies the frequency of the timing signal on the clock line and synchronizes the clock edges of frequency-multiplied clock edges using a synchronizing circuit such as a phase-locked loop or a delay-locked loop. By multiplying the frequency of the same clock signal that is applied to both memory bank integrated circuits 110 and 112, for example by doubling or tripling the clock frequency, extra clock edges are generated artificially and made available internal to the memory integrated circuits so that the different memory integrated circuits are accessed during different clock phases. In particular, data from a first memory integrated circuit 110 is read while reading of the second memory integrated circuit 112 is disabled and vice versa. By synchronizing the frequency-multiplied clock edges within each memory integrated circuit, tight timing control is achieved in which the phase of the timing signals in the different memory integrated circuits is made virtually identical, thereby preventing both integrated circuits from driving data on the shared data bus 120 at the same time. The additional synchronized clock edges make memory bank switching much quicker. Switching is more reliable because timing signals to the output buffers of the two memory banks have much less overlap. Due to this increased reliability, much less system noise is generated.

In some operating modes, the first and second memory bank integrated circuits 110 and 112 are accessed in an interleaved fashion so that, when one memory integrated circuit is reading or writing data, the other memory integrated circuit is not reading or writing data.

Figure 4:
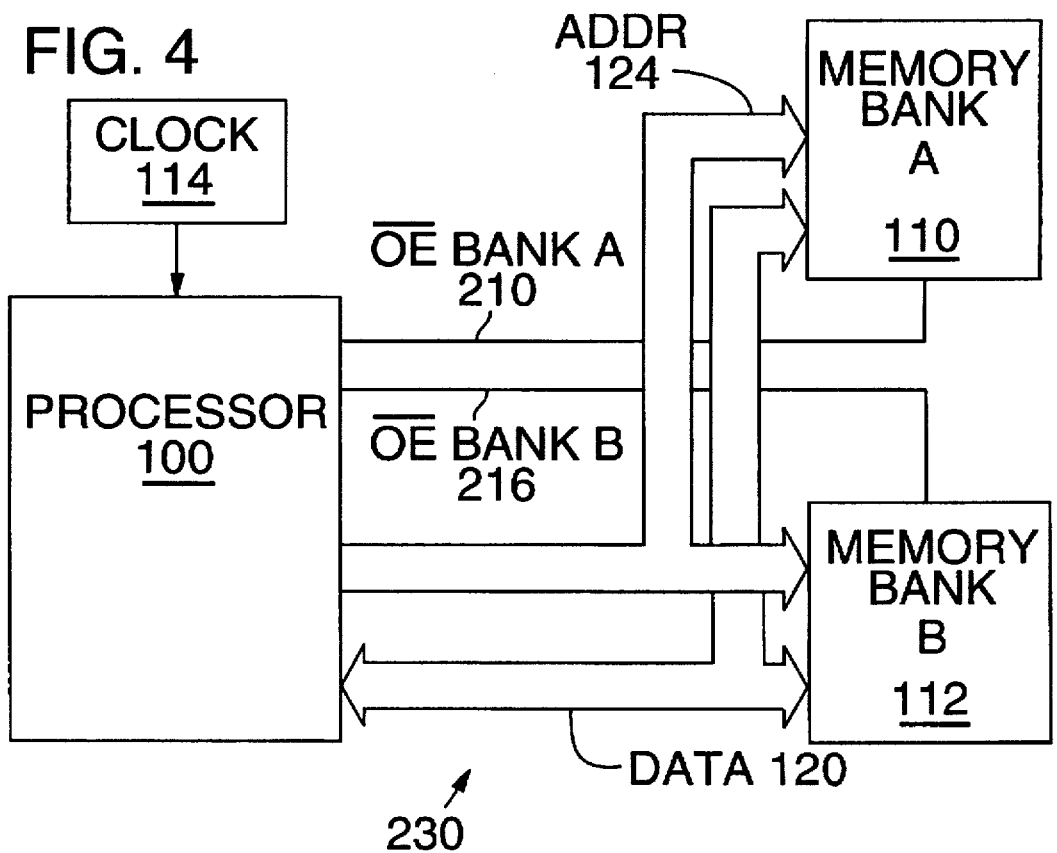
FIG. 4 depicts an embodiment of the computer system of FIG. 3 in which timing is controlled by output enable lines.

Referring to FIG. 4, an embodiment of a computer system 230 having timing signals controlled by output enable lines OE bank A 210 and OE bank B 216 from a microprocessor 100 to memory bank integrated circuits A 110 and B 112. Microprocessor 100 reads data from memory bank integrated circuits 110 and 112 on alternating timing cycles to achieve interleaved data transfer at a high, substantially constant data rate. Microprocessor 100 generates timing signals on output enable lines OE bank A 210 and OE bank B 216 that are substantially equal in frequency but essentially 180° out of phase. Typically, microprocessor 100 supplies output enable signals that are substantially symmetrical biphasic timing signals. Each of the output enable lines OE bank A 210 and OE bank B 216 is respectively connected to a phase-locked loop circuit (not shown) within the corresponding memory bank integrated circuit A 110 and B 112. The phase-locked loop circuits furnish phase-locking and frequency multiplying functions. The phase-locked loop circuit receives an output enable OE timing signal and generates a frequency multiplied version of the timing signal, for example as a doubled, tripled or quadrupled frequency signal. The frequency multiplied timing signal is phase-locked with the output enable signal $\overline{OE}$ of each memory bank integrated circuit 110 and 112. Because the output enable signals on output enable lines $\overline{OE}$ bank A 210 and $\overline{OE}$ bank B 216 are closely related in timing by microprocessor 100, the phase-locked loop furnishes precise control of clock edge timing to exactly align the timing signals in one memory bank integrated circuit with the timing signals in another memory bank integrated circuit.

FIGS. 5A, 5B, 5C, 5D, 5E and 5F illustrate timing diagrams showing a clock frequency which is doubled for interleaving of data access between two memory banks in computer system 230 shown in FIG. 4. Timing is controlled using output enable lines from microprocessor 100. A frequency multiplier (not shown) within each of the memory banks integrated circuits 110 and 112 performs the frequency doubling operation.

FIG. 5A shows timing of a symmetric, biphasic output enable signal A 410 on output enable line $\overline{OE}$ bank A which is generated by microprocessor 100. The output enable signal A 410 on output enable line $\overline{OE}$ bank A is applied to the phase-locked loop and frequency doubler within memory bank integrated circuit A 110, which generates an internal doubled bank A output enable signal 412 shown in FIG. 5B. The output enable signal A 410 and the doubled output enable signal A 412 are connected to logic (not shown) in the memory bank A integrated circuit 110 so that timing edges of the doubled output enable signal A 412 activate and deactivate a bank A data communication signal. This signal controls the output drivers for Bank A. These drivers can be on, driving valid data either to a one state or a zero state; or the drivers can be off with the resulting output voltage determined by other system components. The output driver off condition is represented by signal 414, as is shown in FIG. 5C, as an intermediate level, neither fully high nor fully low. FIG. 5D illustrates timing of a symmetric, biphasic output enable signal B 416 on output enable line $\overline{OE}$ bank B which is generated by microprocessor 100. Microprocessor 100 controls output enable signal B 416 to be closely related in timing to output enable signal A 410. Thus output enable signals A and B are substantially equal in frequency and are 180° out of phase so that one of output enable signals is active while the other is inactive. The output enable signal B 416 on output enable line $\overline{OE}$ bank B is applied to the phase-locked loop and frequency doubler within memory bank integrated circuit B 112, which generates an internal doubled bank B output enable signal 418 shown in FIG. 5E. The output enable signal B 416 and the doubled output enable signal 418 are connected to logic (not shown) in the memory bank B integrated circuit 112 so that timing edges of the doubled output enable signal B 418 activate and deactivate data output/signals 420, as is shown in FIG. 5F. The phase-locked loop circuits in memory bank integrated circuits A 110 and B 112 advantageously furnish precise control of clock edge timing to exactly align the timing signals in one memory chip with the timing signals in another memory chip despite variability in temperature, process and voltage parameters between the chips.

However, often output enable signals A 410 and B 416 do not have the ideal relationship shown in FIGS. 5A and 5I). One output signal is typically generated by passing the other output signal through an inverter. The delay in passing the signal through the inverter always causes a lag in the inverted signal. Accordingly, doubled output enable signals A 412 and B 418 are always out of synchrony. Accordingly, to avoid overlap of signals, output signals A 414 and B 420 are "on" for only half of the double clock cycle.

Frequency doubling is the minimum amount of frequency multiplication which allows for interleaved operation of two memory banks. When the system clock frequency is doubled, an extra clock edge, for example clock edge 422 is supplied halfway between system clock edges 424 and 426. When the system clock frequency is doubled, a first memory bank must be quickly deactivated and the second memory bank quickly activated simultaneously. To avoid bus contention, the finite amount of time required to deactivate of a bank must always be less than the amount of time necessary to activate the other bank. Performance standards requiring rigidly precise activation and deactivation times and virtually immediate, step-function type activation and deactivation responses are very difficult to achieve in electronic circuits. Therefore, a higher frequency multiplication factor is desired to provide additional timing edges for optimal control.

FIGS. 6A, 6B, 6C, 6D, 6E and 6F illustrate timing diagrams showing a clock frequency which is quadrupled for interleaving of data access between two memory banks in computer system 230 shown in FIG. 4. Timing is controlled using output enable lines from microprocessor 100. A frequency multiplier (not shown) within each of the memory banks integrated circuits 110 and 112 performs the frequency quadrupling operation.

FIG. 6A shows timing of a symmetric, biphasic output enable signal A 430 on output enable line $\overline{OE}$ bank A which is generated by microprocessor 100. The output enable signal A 430 on output enable line $\overline{OE}$ bank A is applied to the phase-locked loop and frequency quadrupler within memory bank integrated circuit A 110, which generates an internal quadrupled bank A output enable signal 432 shown in FIG. 6B. The output enable signal A 430 and the quadrupled output enable signal A 432 are connected to logic (not shown) in the memory bank A integrated circuit 110 so that timing edges of the quadrupled output enable signal A 432 activate and deactivate bank A data output signals 434, as is shown in FIG. 6C. FIG. 6D illustrates timing of a symmetric, biphasic output enable signal B 436 on output enable line $\overline{OE}$ bank B which is generated by microprocessor 100. Microprocessor 100 controls output enable signal B 436 to be closely related in timing to output enable signal A 430. Thus output enable signals A and B are substantially equal in frequency and are 180° out of phase so that one of output enable signals is active while the other is inactive. The output enable signal B 436 on output enable line $\overline{OE}$ bank B is applied to the phase-locked loop and frequency quadrupler within memory bank integrated circuit B 112, which generates an internal quadrupled bank B output enable signal 438 shown in FIG. 6E. The output enable signal B 436 and the quadrupled output enable signal 438 are connected to logic (not shown) in the memory bank B integrated circuit 112 so that timing edges of the quadrupled output enable signal B 438 activate and deactivate bank B data output signals 440, as is shown in FIG. 6F. The phase-locked loop circuits in memory bank integrated circuits A 110 and B 112 advantageously furnish precise control of clock edge timing to exactly align the timing signals in one memory chip with the timing signals in another memory chip despite variability in temperature, process and voltage parameters between the chips.

Frequency multiplication by a factor more than two, such as frequency tripling or quadrupling, allows a time interval to transpire between the deactivation of a first memory bank and activation of a second memory bank. For example, when the clock frequency is quadrupled, a first quarter of a timing cycle is used to activate a first memory bank, a second quarter and fourth quarter of the timing cycle furnish spacing intervals during which neither the first nor a second bank are activated, a third quarter is used for activation of the second memory bank. Thus, clock quadrupling furnishes a forced separation between activation of the two banks to ensure against possible overlap.

Figure 7:
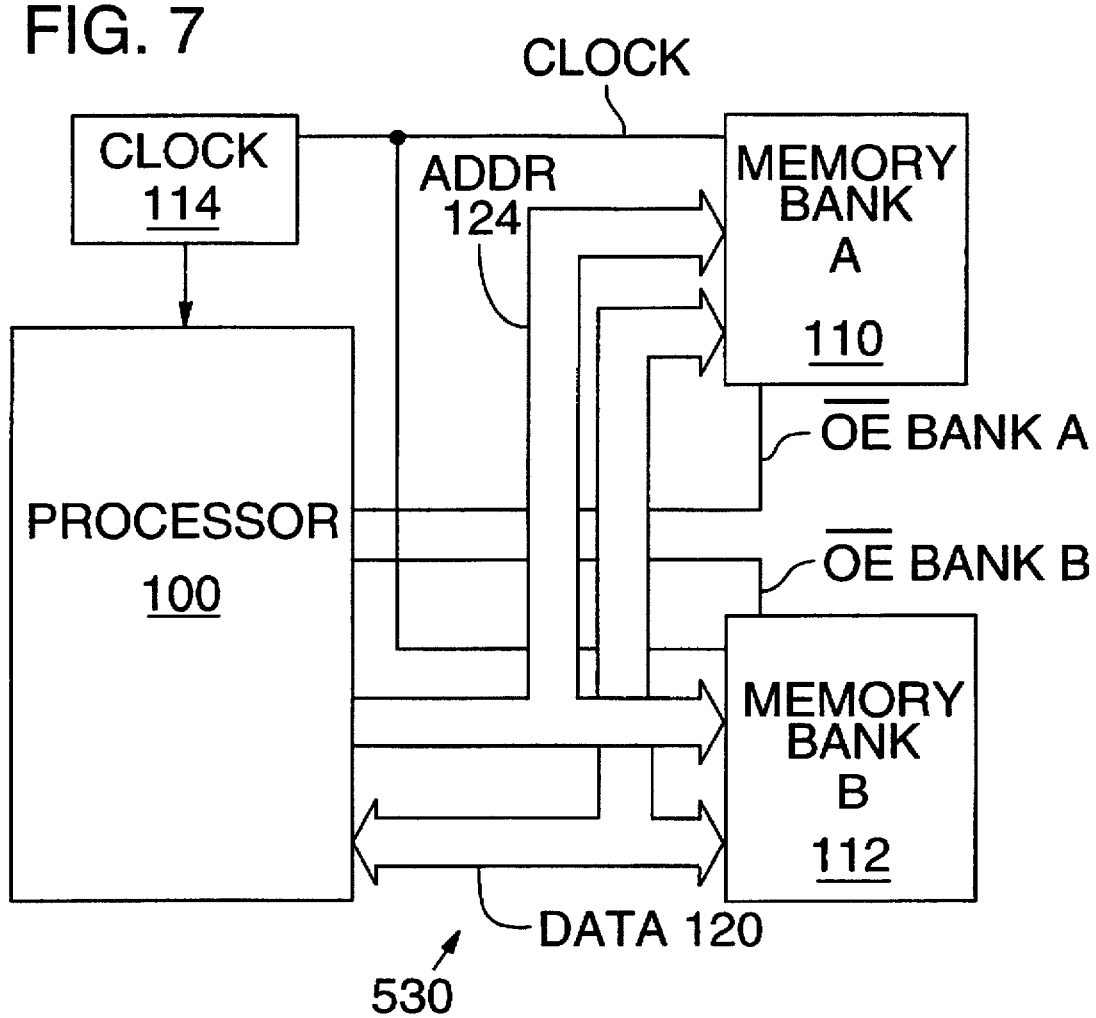
FIG. 7 depicts an embodiment of the computer system of FIG. 3 in which timing is controlled by a clock line.

Referring to FIG. 7, an embodiment of a computer system 530 having timing signals controlled by output enable lines $\overline{OE}$ bank A and $\overline{OE}$ bank B from a microprocessor 100 to memory bank integrated circuits A 110 and B 112. Microprocessor 100 reads data from memory bank integrated circuits 110 and 112 on alternating timing cycles to achieve interleaved data transfer at a high, substantially constant data rate. Microprocessor 100 receives timing signals on a clock line CLOCK and uses these timing signals to generate output enable signals on output enable lines $\overline{OE}$ bank A and $\overline{OE}$ bank B that are substantially equal in frequency but essentially 180° out of phase. Output enable line $\overline{OE}$ bank A is connected from microprocessor 100 to memory bank integrated circuit A 110. Output enable line $\overline{OE}$ bank B is connected from microprocessor 100 to memory bank integrated circuit B 112. The clock line CLOCK is connected to each of memory bank integrated circuits A 110 and B 112 and is connected within each of the circuits to a phase-locked loop circuit (not shown). The phase-locked loop circuit furnishes phase-locking and frequency multiplying functions. The phase-locked loop circuit receives a clock timing signal and generates a frequency multiplied version of the timing signal, such as a doubled, tripled or quadrupled frequency signal for example. The frequency multiplied timing signal is phase-locked with the clock timing signal of each memory bank integrated circuit 110 and 112. Because a single timing clock signal is applied on the clock line CLOCK to both of the memory bank integrated circuits A 110 and B 112, the phase-locked loop furnishes precise control of clock edge timing to exactly align the timing signals in one memory bank integrated circuit with the timing signals in another memory bank integrated circuit.

FIGS. 8A, 8B, 8C, 8D, 8E and 8F illustrate timing diagrams showing a clock frequency which is doubled for interleaving of data access between two memory banks in computer system 530 shown in FIG. 7. Timing is controlled using a timing clock signal on the clock line CLOCK and output enable signals on output enable lines from microprocessor 100. A frequency multiplier (not shown) within each of the memory banks integrated circuits 110 and 112 performs the frequency doubling operation.

Figure 8:
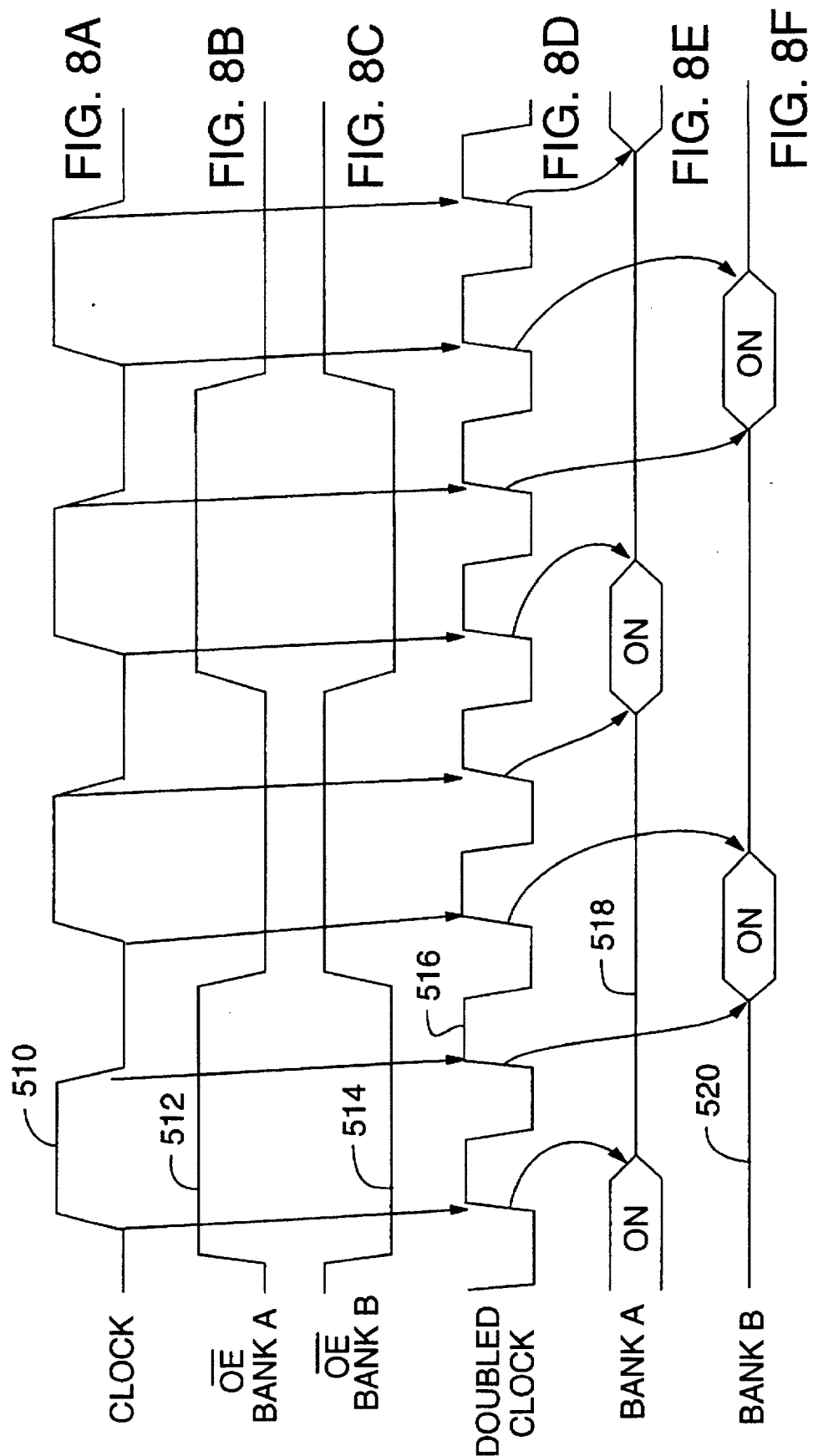
FIGS. 8A, 8B, 8C, 8D, 8E and 8F illustrate timing diagrams showing a clock frequency which is doubled for interleaving of data access between two memory banks in a computer system in which timing is controlled using output enable lines.

FIG. 8A shows timing of a symmetric, biphasic clock timing signal 510 on clock line CLOCK which is generated by clock circuit 114. FIG. 8B shows timing of a symmetric, biphasic output enable signal A 512 on output enable line $\overline{OE}$ bank A which is generated by microprocessor 100. FIG. 8C illustrates timing of a symmetric, biphasic output enable signal B 514 on output enable line $\overline{OE}$ bank B which is generated by microprocessor 100. Microprocessor 100 controls output enable signal B 514 to be closely related in timing to output enable signal A 512. Thus output enable signals A and B are substantially equal in frequency and are 180° out of phase so that one of output enable signals is active while the other is inactive. The clock timing signal 510 on clock CLOCK is applied to the phase-locked loop and frequency doublers within both memory bank integrated circuits A 110 and B 112, thereby generating substantially equivalent doubled clock signals 516 in memory bank equivalent circuits A 110 and B 112, shown in FIG. 8D. The output enable signal A 512 and the doubled clock signal 516 in memory bank integrated circuit A 110 are connected to logic (not shown) in the memory bank A integrated circuit 110 so that timing edges of the doubled clock signal 516 activate and deactivate bank A data output signals 518, as is shown in FIG. 8E. The output enable signal B 514 and the doubled clock signal 516 in memory bank integrated circuit B 112 are connected to logic (not shown) in the memory bank B integrated circuit 112 so that timing edges of the doubled clock signal 516 activate and deactivate bank B data output signals 520, shown in FIG. 8F. The phase-locked loop circuits in memory bank integrated circuits A 110 and B 112 advantageously furnish precise control of clock edge timing to exactly align the timing signals in one memory chip with the timing signals in another memory chip despite variability in temperature, process and voltage parameters between the chips.

Figure 9:
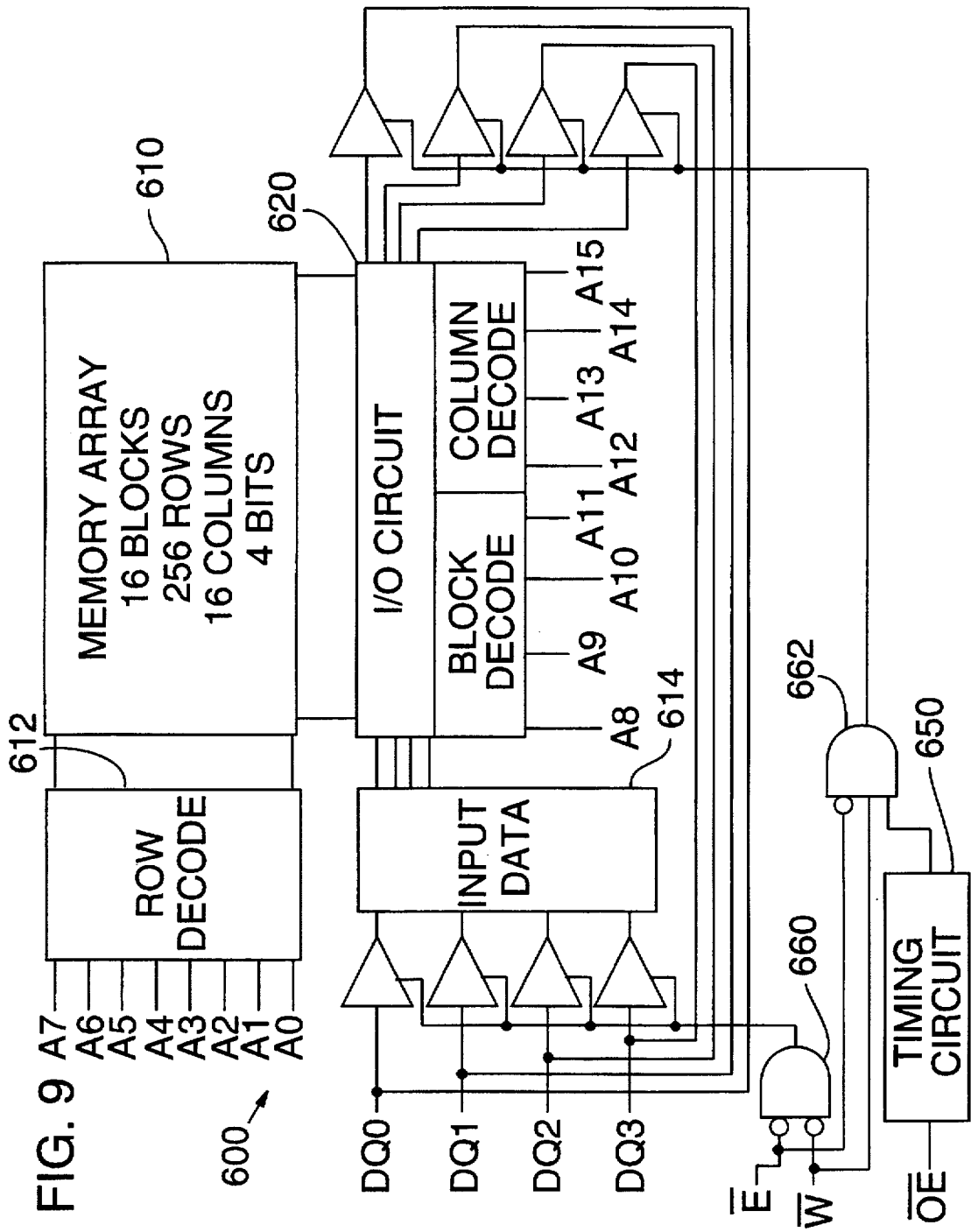
FIG. 9 illustrates a static RAM memory in accordance with an embodiment of the present invention.

FIG. 9 illustrates a static RAM memory 600, for example a CMOS static RAM memory. The static RAM memory 600 typically operates at a slower speed than a high-performance microprocessor which accesses the memory 600 so that a computer system advantageously utilizes two banks of static RAM memory operating in an interleaved fashion. The static RAM memory 600 includes a memory array 610. Memory cells within the memory army 610 are addressed using a row decode circuit 612 and an I/O circuit 620. The I/O circuit 620 includes block decode and column decode circuitry. The static RAM memory 600 also includes an input data circuit 614 which supplies control signals to the I/O circuit 620. A timing circuit 650 and AND gates 660 and 662 furnish timing control within the static RAM memory 600.

A chip enable signal $\overline{E}$ is applied to a first input terminal of an AND gate 660 and a write enable signal $\overline{W}$ is applied to a second input terminal of AND gate 660 so that data is written from the data bus lines DQ0, DQ1, DQ2 and DQ3 during write cycles, when both $\overline{E}$ and $\overline{W}$ are LOW. Data is transferred from the DQ lines to the memory specified by address lines A0–AN. The chip enable signal $\overline{E}$ is also applied to a first input terminal of an AND gate 662 and the write enable signal $\overline{W}$ is applied to a second input terminal of AND gate 662 so that when $\overline{E}$ is LOW and $\overline{W}$ is HIGH and an output enable line $\overline{OE}$ is properly defined to allow a read operation, a static read operation of the memory location specified by the address lines A0–AN takes place. The memory array 610 and I/O circuit 620 are activated substantially before data is transferred. For example, in a data READ operation, transistors (not shown) in the memory array are precharged in accordance with the applied address lines and the logic levels of data stored in the array while the output lines are maintained in an inactive state. The output enable line $\overline{OE}$ is applied to a timing circuit 650 which includes a frequency multiplier (not shown) and a synchronizing circuit (not shown). A frequency-multiplied and synchronized timing signal is generated by the timing circuit 650 and applied to the AND gate 662 along with the $\overline{E}$ and $\overline{W}$ signals so that the multiplied and synchronized timing signal manages the data bus DQ to prevent bus contention.

Therefore, in a system utilizing two memory chips 600 both memory chips are activated at all times, but the output lines are kept inactive so that data is not read from the memories until an appropriate time which is precisely controlled by the timing circuit 650. Incorporation of the timing circuit 650 is thus highly advantageous since the typical basic activation operations of a memory device, including sensing of data logic levels and communicating the sensed data to the output lines, are relatively slow. However, the last stage of the data output operation, the act of activating the output lines, is very fast and is precisely controlled.

Thus, two memory chips are included in a memory system and the memories of both chips are essentially always activated. The output enable line $\overline{OE}$ is frequency multiplied and synchronized by timing circuits in each memory chip to quickly and accurately output interleaved data from the memories.

Figure 10:
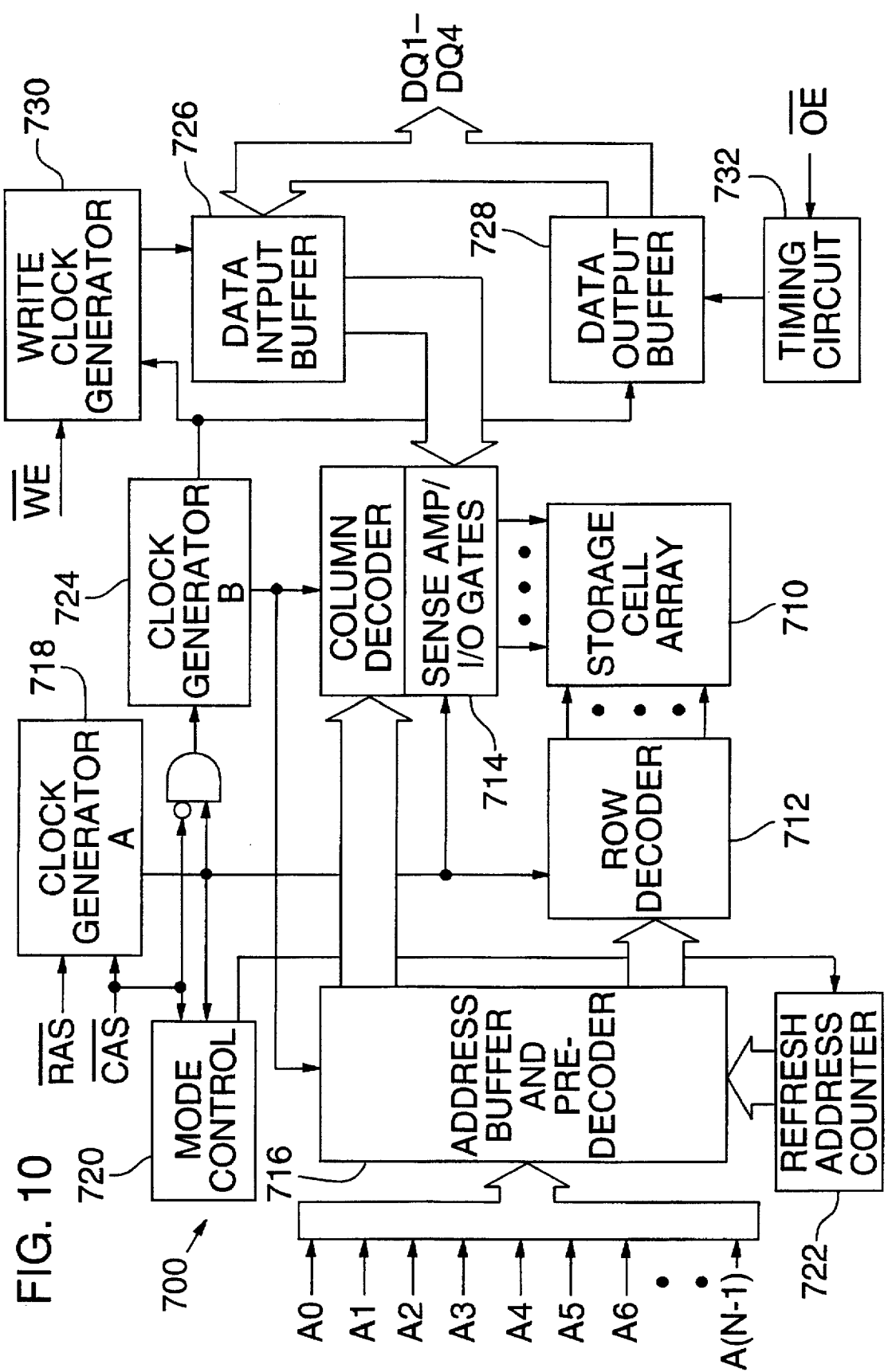
FIG. 10 illustrates a dynamic RAM memory in accordance with an embodiment of the present invention.

FIG. 10 illustrates a dynamic RAM memory 700, for example a CMOS dynamic RAM memory. The dynamic RAM memory 700 typically operates at a slower speed than a high-performance microprocessor which accesses the memory 700 so that a computer system advantageously utilizes two banks of dynamic RAM memory operating in an interleaved fashion. The dynamic RAM memory 700 includes a storage cell array 710. Memory cells within the storage cell array 710 are addressed using a row decoder 712 and a column decoder 714. The column decoder 714 includes a sense amplifier and input/output gates. Address signals are applied from an external address bus including address lines A0, A1 . . A(N.1) to an address buffer and predecoder 716. Address buffer and predecoder 716 selects suitable bit address lines and connects the lines to the row decoder 712 and column decoder 714. Row and column select signals $\overline{RAS}$ and $\overline{CAS}$ are connected to a clock generator A circuit 718 which is connected by control lines to the row decoder 712 and column decoder 714. Clock generator A 718 also applies control signals to a mode control circuit 720 which, in turn, furnishes a refresh control signal to refresh address counter 722. Refresh address counter 722 supplies control signals to the address buffer and predecoder 716. A clock generator B 724 supplies timing signals to the column decoder 714. An external data bus including data lines DQ1–DQ4 communicates data to and from the storage cell array 710 via data input buffer 726 and data output buffer 728. Timing signals to the data input buffer 726 and data output buffer 728 are supplied by clock generator B 724 via a write clock generator circuit 730. A timing circuit 732 receives an output enable signal from an external output enable line $\overline{OE}$ and generates timing signals which are applied to the data output buffer 728. The timing circuit 732 includes a phase-locked loop circuit (not shown) and a frequency multiplier (not shown).

In the illustrative embodiment of a dynamic RAM memory 700 shown in FIG. 10, a plurality of up to 21 N input bits are used to decode addresses in the storage cell array 710. Only N address bits, maximum, are connected to the address buffer and predecoder 716 so that column and row input signals are separately strobed by the $\overline{CAS}$ and $\overline{RAS}$ signals. First, a maximum of N row address bits are input on pins A0 through A(N−1) and latched with the row address strobe $\overline{RAS}$, then a maximum of N column address bits are input on pins A0 through A(N−1) and latched with the column address strobe $\overline{CAS}$. Both the row and column addresses are made stable on or before the falling edge of $\overline{CAS}$ and $\overline{RAS}$, respectively. Read and write modes are distinguished by the logic state of write enable line $\overline{W}$. When $\overline{W}$ is active low, a write cycle is initiated. When $\overline{W}$ is high, a read operation is selected. During the read mode, input data is ignored.

The data input buffer 726 and the data output buffer 728 are tri-state buffers, which are TTL compatible. Data output buffer 728 remains in a high impedance state until the column address strobe $\overline{CAS}$ goes low. When a read or read-modify-write cycle is executed, valid output signals are obtained a suitable time interval following the falling edges of the $\overline{RAS}$ and $\overline{CAS}$ signals and a suitable time interval following the falling edge of the output enable $\overline{OE}$ clock signal. The data remains valid until either $\overline{CAS}$ or $\overline{OE}$ returns to a high logic level.

The storage cell array 710 and the sense amplifier and I/O gates within the column decoder 714 are activated by the $\overline{CAS}$ and $\overline{RAS}$ signals substantially before data is transferred. For example, in a data READ operation, transistors (not shown) in the storage cell array 710 are precharged in accordance with the applied address lines and the logic levels of data stored in the array while the output lines are maintained in an inactive state. An output enable line $\overline{OE}$ is applied to the timing circuit 732 which includes a frequency multiplier (not shown) and a synchronizing circuit (not shown). A frequency-multiplied and synchronized timing signal is generated by the timing circuit 732 and applied to the data output buffer 728 so that a multiplied and synchronized timing signal manages the data bus DQ to prevent bus contention.

Figure 11:
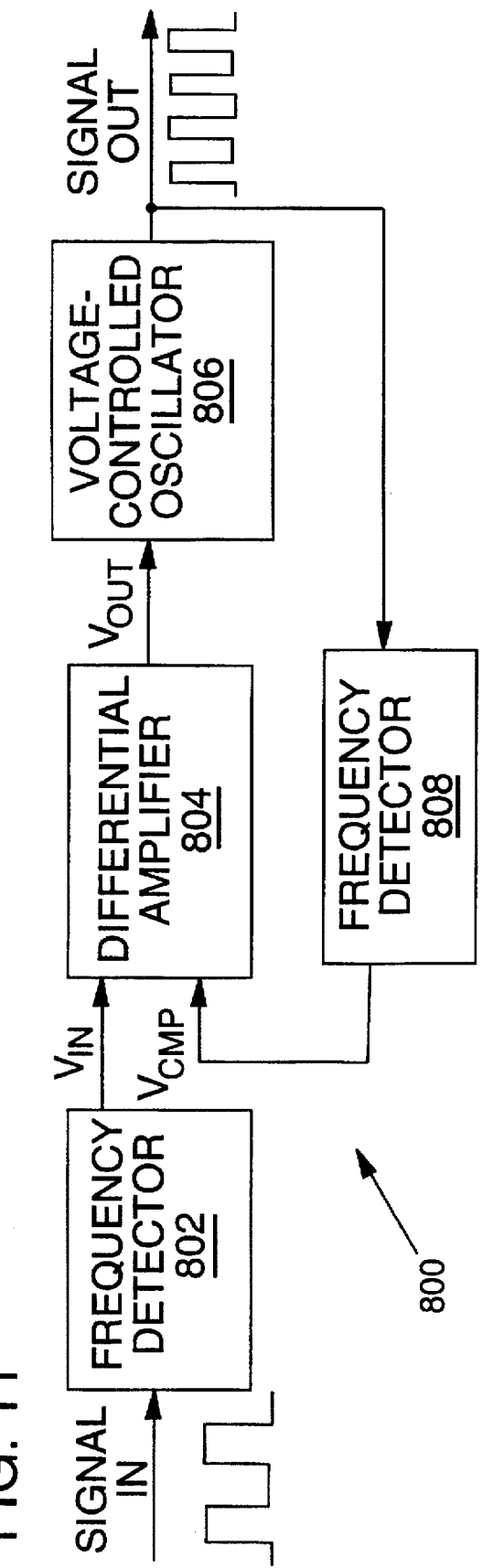
FIG. 11 illustrates a: high-level schematic block diagram of a phase-locked loop circuit which furnishes frequency multiplication and division.

The schematic block diagram shown in FIG. 11 depicts a suitable frequency multiplier and phase-locked loop circuit 800 for precisely controlling activation and deactivation times for driving busses connected to each of multiple memory banks. Other frequency multipliers and phase-locked loop circuits may be suitable as well. The frequency multiplier and phase-locked loop circuit 800 is included, for example, in the timing circuit 650 shown in FIG. 9 and the timing circuit 732 shown in FIG. 10. The phase-locked loop circuit 800 is employed to precisely control this timing despite variability in conditions of temperature, power supply voltage and device fabrication among the memory banks.

The phase-locked loop circuit 800 is configurable to furnish either frequency multiplication or frequency division, although it is used as a frequency multiplier in the illustrative embodiment and application. The phase-locked loop circuit 800 accepts input signal (SIGNAL IN) pulses having a frequency $f_{IN}$ and generates an output signal (SIGNAL OUT) having a frequency $f_{OUT}$ that is equal to M times $f_{IN}$, where M is a constant that is determined by values of components within the circuit 800. SIGNAL IN is applied to a frequency detector 802, which converts the SIGNAL IN frequency to a DC voltage $V_{IN}$ having a constant amplitude. Such circuits are well known in the art. Frequency detector 802 is connected to a differential amplifier 804, supplying $V_{IN}$ to a first differential amplifier 804 input terminals. The differential amplifier 804 also receives a voltage signal $V_{CMP}$ at a second input terminal for comparison to $V_{IN}$. Differential amplifier 804 compares the voltages $V_{IN}$ and $V_{CMP}$ and generates a DC output voltage $V_{OUT}$ as a function of the comparison result. Such circuits are well known in the art. Differential amplifier 804 is connected to a voltage-controlled oscillator 806, supplying the $V_{OUT}$ signal to the voltage-controlled oscillator 806 input. The voltage-controlled oscillator 806 generates an oscillating signal (SIGNAL OUT) that alternates between a substantially constant high amplitude and a substantially constant low amplitude, which has a frequency that varies as the difference between $V_{IN}$ and $V_{CMP}$ varies. Such circuits are well known in the art. A line carrying SIGNAL OUT is connected from the voltage-controlled oscillator 806 to a frequency detector 808, which converts the SIGNAL OUT frequency to the $V_{CMP}$ voltage. Such circuits are well known in the art.

A phase-locked loop servo is a closed-loop control system that is commonly used in communication systems for frequency modulation and bit synchronization. The phase-locked loop circuit 800 is applied to a memory circuit to prevent bus contention, eliminating degradation in performance reliability that results when multiple memory banks drive signals onto busses simultaneously, causing a momentary short-circuit condition. Phase-locked loop circuit 800 continuously attempts to lock the signals SIGNAL IN and SIGNAL OUT. When the signals are locked, the input and output signals have a constant phase difference, even though the output signal has the same frequency as the input signal or a frequency that is a selected multiple or fraction of the input signal frequency. Any deviation from the desired phase difference is detected by the differential amplifier 804 and transmitted to voltage-controlled oscillator 806 to correct the error.

Figure 12:
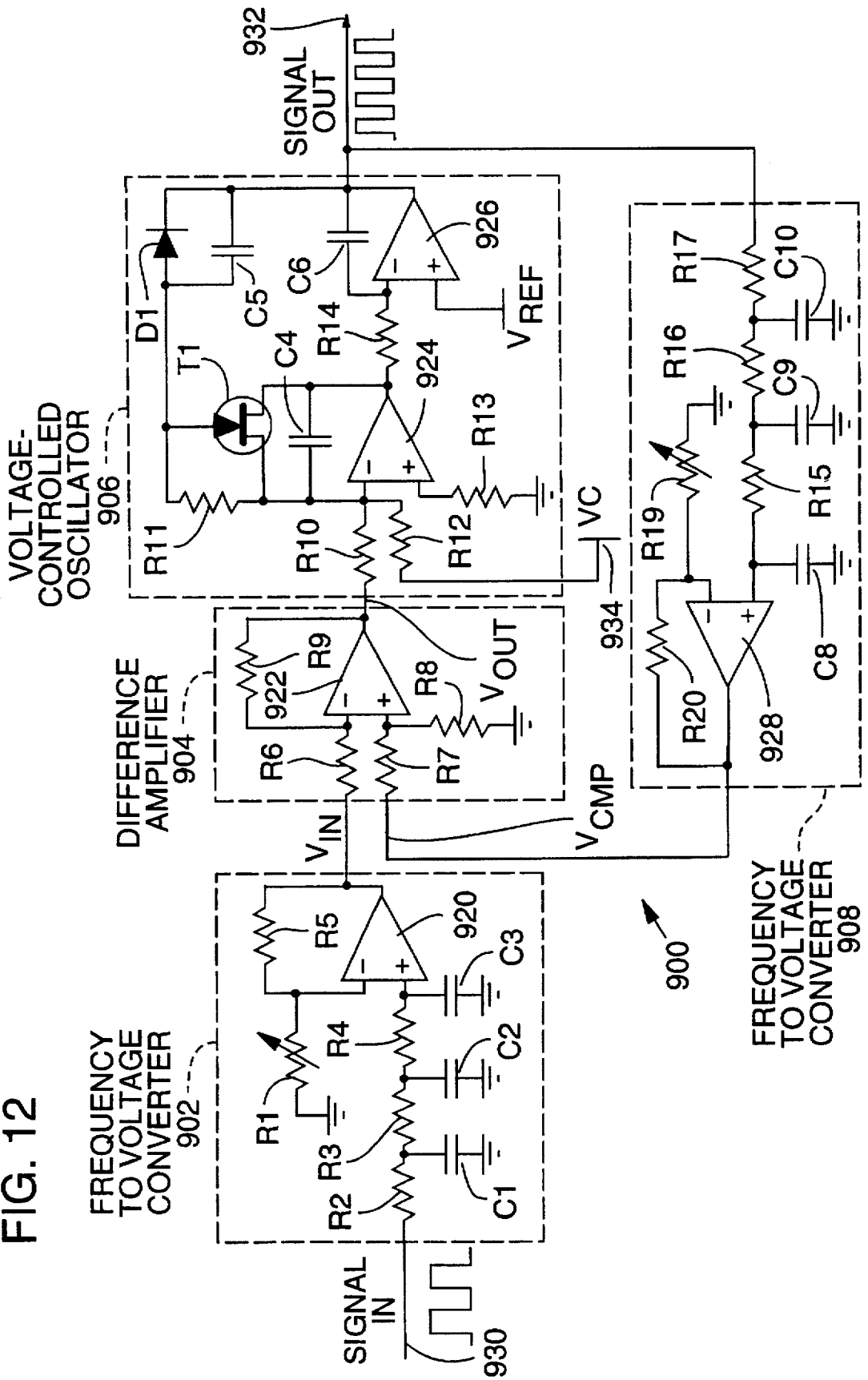
FIG. 12 depicts a schematic diagram of a phase-locked loop circuit which furnishes frequency multiplication and division.

The circuit diagram of FIG. 12 illustrates blocks shown in FIG. 11 in greater detail to furnish a frequency multiplier and phase-locked loop circuit 900. The frequency multiplier and phase-locked loop circuit 900 is included, for example, in the timing circuit 650 shown in FIG. 9 and e timing circuit 732 shown in FIG. 10. A frequency to voltage converter 902 receives the SIGNAL IN and is connected to a difference amplifier 904 to furnish the DC input voltage $V_{IN}$. The difference amplifier 904 compares $V_{IN}$ to a $V_{CMP}$ signal that is supplied by a frequency to voltage converter 908 and is connected to a voltage-controlled oscillator 906 to supply an output voltage $V_{OUT}$. The voltage-controlled oscillator 906 generates an output signal as a function of $V_{OUT}$. The voltage-controlled oscillator 906 is connected to a frequency to voltage converter 908, supplying SIGNAL OUT. The frequency to voltage converter 908 converts the frequency of SIGNAL OUT to a comparison voltage $V_{CMP}$. The frequency to voltage converter 908 is connected to the difference amplifier 904, supplying $V_{CMP}$, which the difference amplifier 904 compares to $V_{IN}$. In accordance with equation 1, the DC voltages $V_{IN}$ and $V_{OUT}$ are proportional to the frequencies of respective signals SIGNAL IN and SIGNAL OUT so that $$V_{IN}=K_{IN}f_{IN}, \qquad (1)$$

$$V_{CMP}=K_{OUT}f_{OUT},$$

in which $f_{IN}$ and $f_{OUT}$ are respective frequencies of SIGNAL IN and SIGNAL OUT and $K_{IN}$ and $K_{OUT}$ are constants which are determined by component values in the phase-locked loop circuit 900. The output voltage $V_{OUT}$ furnished by the difference amplifier 904 is the difference between the voltages $V_{IN}$ and $V_{CMP}$ as shown in equation 2 so that $$V_{OUT}=A(V_{IN}-V_{CMP})=A(K_{IN}f_{IN}-K_{OUT}f_{OUT}), \qquad (2)$$

where A is the gain of the difference amplifier 904. For a large amplifier gain A, the frequency of SIGNAL OUT is shown in equation 3, as follows:

$$f_{OUT}=(K_{IN}/K_{OUT})f_{IN}=Mf_{IN}, \qquad (3)$$

in which M is a frequency multiplier indicating the relative frequencies of SIGNAL IN and SIGNAL OUT. $K_{IN}$ and $K_{OUT}$ are selected to multiply or divide the frequency of SIGNAL IN to furnish the frequency of SIGNAL OUT. A suitable multiplication factor for a phase-locked loop circuit 900 used for driving multiple memory banks is a 2×factor.

Frequency to voltage converter 902 includes resistors R2, R3 and R4 connected in series from the input lead 930 which receives SIGNAL IN to the positive input of amplifier 920. A capacitor C1 is connected from a junction point between resistors R2 and R3 to ground. A capacitor C2 is connected from a junction point between resistors R3 and R4 to ground. A capacitor C3 is connected from a junction point between resistor R4 and amplifier 920 to ground. Resistors R2, R3 and R4 and capacitors C1, C2 and C3 supply low-pass filtering of SIGNAL IN. A resistor R5 is connected between the minus input terminal and the output terminal of the amplifier 920. A variable resistor R1 is connected from a junction point between resistor R5 and the minus input terminal of amplifier 920 and ground. The variable resistor R1 is adjusted to determine the constant $K_{IN}$ and to thereby select the multiplication factor M of the phase-locked loop circuit 900. The output of the amplifier 920 is the voltage $V_{IN}$, which is applied to the difference amplifier 904.

Difference amplifier 904 includes an amplifier 922. A resistor R6 is connected between the minus input terminal of the amplifier 922 and the output of the amplifier 920 of the frequency to voltage converter 902, which supplies the DC voltage $V_{IN}$. A resistor R7 is connected between the plus input terminal of the amplifier 922 and the output of the amplifier 928 of the frequency to voltage converter 908, which supplies the DC voltage $V_{CMP}$. A resistor R8 is connected from a junction point between resistor R7 and amplifier 922 to ground. A resistor R9 is connected between the minus input terminal and the output terminal of the amplifier 922.

Voltage-controlled oscillator 906 includes an amplifier 924, an amplifier 926 and an N-channel field effect transistor T1. A resistor R10 is connected between the minus input terminal of the amplifier 924 and the output of the amplifier 922 of the difference amplifier 904, which supplies the DC voltage $V_{OUT}$. A resistor R11 is connected between the minus input terminal of the amplifier 924 and a reference voltage line which supplies a reference voltage $V_c$. Voltage $V_c$ determines the free-running frequency of the voltage-controlled oscillator 906. A resistor R13 is connected from the plus input terminal of the amplifier 924 and ground. A capacitor C4 is connected between the output terminal of the amplifier 924 and the minus input terminal of the amplifier 924. The source-drain path of the transistor T1 is connected between the output terminal of the amplifier 924 and the minus input terminal of the amplifier 924, in parallel with the capacitor C4. A resistor R14 connects the output terminal of the amplifier 924 to the minus input terminal of the amplifier 926. The plus input terminal of the amplifier 926 receives a reference voltage line which supplies a reference voltage $V_{REF}$. A capacitor C6 is connected between the output terminal of the amplifier 926 and the minus input terminal of the amplifier 926. A diode D1 is connected to allow current flow substantially only from the gate of transistor T1 to the output terminal of the amplifier 926. A capacitor C5 is connected between the gate of the transistor T1 and the output terminal of the amplifier 926, in parallel with the diode D1.

Frequency to voltage converter 908 includes resistors R15, R16 and R17 connected in series from the output lead 932 which communicates SIGNAL OUT to the positive input of amplifier 928. A capacitor C10 is connected from a junction point between resistors R16 and R17 to ground. A capacitor C9 is connected from a junction point between resistors R15 and R16 to ground. A capacitor C8 is connected from a junction point between resistor R15 and amplifier 928 to ground. Resistors R15, R16 and R17 and capacitors C8, C9 and C10 supply low-pass filtering of SIGNAL OUT. A resistor R20 is connected between the minus input terminal and the output terminal of the amplifier 928. A variable resistor R19 is connected between the minus input terminal of amplifier 928 and ground. The variable resistor R19 is adjusted to determine the constant $K_{OUT}$ and to thereby select the multiplication factor M of the phase-locked loop circuit 900. The output of the amplifier 928 is the voltage $V_{CMP}$, which is applied to the difference amplifier 904.

FIGS. 11 and 12 illustrate synchronizing circuits which utilize a phase-locked loop. In other embodiments, a delay-locked loop is used, rather than a phase-locked loop. A delay-locked loop circuit, which is well-known in the electronic arts, utilizes precise delay lines between the memory banks to synchronize the timing signals of one bank to the timing signals of another bank. A phase-locked loop circuit is preferred over a delay-locked loop in CMOS embodiments because the precise delay lines used in a CMOS delay-locked loop circuits are typically very large, requiring a substantial die area and thus, reducing product yields and increasing costs. In contrast, a phase-locked loop circuit does not require precise delay elements but instead uses feedback to make timing reliable.

The description of certain embodiments of this invention is intended to be illustrative and not limiting. Numerous other embodiments will be apparent to those skilled in the art, all of which are included within the broad scope of this invention. For example, illustrative embodiments of a static RAM and a dynamic RAM memory are described but other types of memories, including RAMDAC circuits, dual-port static RAMs, video RAMs, and ROMs and the like are within the invention scope. Furthermore, although CMOS memories are specifically described, other suitable technologies are also utilized. Furthermore, although frequency multiplication and synchronization are applied to an output enable signal $\overline{OE}$ in the illustrative embodiments, other timing signals such as a $\overline{CAS}$ signal of a dynamic RAM or a serial clock line of a video RAM are also included within the scope of the invention.

We claim:

1. An integrated circuit memory comprising:
   memory array; and
   a timing circuit coupled to the memory array via an internal clock line and coupled to an external signal clock line, the timing circuit including:
   a clock multiplier and clock edge synchronizing circuit having an input terminal coupled to the external signal clock line and having an output terminal coupled to the internal clock line, wherein the clock multiplier and clock edge synchronizing circuit multiplies a timing signal provided on the external clock line.

2. A memory according to claim 1 further comprising:
   an input/output circuit coupled to the memory array by a plurality of internal data lines;
   a decoding circuit coupled to the memory array and the input/output circuit by a plurality of decoded address lines; and
   a control circuit coupled to the input/output circuit by a control line and coupled to the internal clock line; wherein
   the timing circuit is coupled to the internal clock line.

3. A memory according to claim 1 wherein the clock multiplier and clock edge synchronizing circuit includes a phase-locked loop circuit configurable to furnish frequency multiplication.

4. A memory according to claim 1 wherein the clock multiplier and clock edge synchronizing circuit includes a delay-locked loop circuit configurable to furnish frequency multiplication.

5. A memory according to claim 1 wherein the clock multiplier and clock edge synchronizing circuit multiplies a timing signal provided on the external clock line by N where N is an integer.

6. A memory according to claim 1 wherein the clock multiplier and clock edge synchronizing circuit includes a clock doubler.

7. A memory according to claim 1 wherein the clock multiplier and clock edge synchronizing circuit includes a clock tripler.

8. A memory according to claim 1 wherein the clock multiplier and clock edge synchronizing circuit includes a clock quadrupler.

9. A memory according to claim 1 wherein the clock multiplier and clock edge synchronizing circuit generates a plurality of internal timing signals on the internal clock line for each external clock signal on the external signal clock line.

10. A memory according to claim 1 wherein the memory array includes a static RAM memory.

11. A memory according to claim 1 wherein the memory array includes a video RAM memory.

12. A memory according to claim 1 wherein the memory array includes a dynamic RAM memory.

13. A memory according to claim 1 wherein the memory array includes a dynamic ROM memory.

14. A memory according to claim 1 wherein the memory array includes a static ROM memory.

15. A memory according to claim 1 wherein the memory array includes a RAMDAC circuit.

16. A computer system comprising:
    a memory controller;
    a data bus coupled to the memory controller; and
    a plurality of memory banks coupled to the data bus and mutually sharing data bus access, each of the plurality of memory banks being an integrated circuit memory including:
    a memory array; and
    a timing circuit coupled to the memory array via an internal clock line and coupled to an external signal clock line, the timing circuit including:
    a clock multiplier and clock edge synchronizing circuit having an input terminal coupled to the external signal clock line and having an output terminal coupled to the internal clock line, wherein the clock multiplier and clock edge synchronizing circuit multiplies a timing signal provided on the external clock line.

17. A computer system according to claim 16 further comprising:
    an input/output circuit coupled to the memory by a plurality of internal data lines;
    a decoding circuit coupled to the memory array and the input/output circuit by a plurality of decoded address lines; and
    a control circuit coupled to the input/output circuit by a control line and coupled to the internal clock line; wherein
    the timing circuit is coupled to the internal clock line.

18. A method of operating a plurality of memory banks comprising the steps of:
    receiving a clock signal at a clock frequency;
    multiplying the clock frequency to generate multiple clock edges;
    timing a plurality of phases of the clock signal with the clock edges;
    synchronizing timing of the multiple clock edges; and
    driving a plurality of memory banks, each memory bank being driven with selected individual clock edge of the multiple clock edges.

19. A method according to claim 18 wherein the synchronizing step includes synchronizing clock edges using a phase-locked loop circuit.

20. A method according to claim 18 wherein the synchronizing step includes synchronizing clock edges using a delay-locked loop circuit.

21. A method according to claim 18 wherein the clock frequency multiplying step includes a step of multiplying the frequency by N where is an integer.

22. A method according to claim 18 wherein the clock frequency multiplying step includes a step of doubling the frequency.

23. A method according to claim 18 wherein the clock frequency multiplying step includes a step of tripling the frequency.

24. A method according to claim 18 wherein the clock frequency multiplying step includes a step of quadrupling the frequency.

25. A memory according to claim 1 where the timing signal is an enable signal from a processor.

26. A memory according to claim 1 where the timing signal is a clock signal from a clock circuit.

27. A memory according to claim 16 where the timing signal is an enable signal from the memory controller.

28. A memory according to claim 16 where the timing signal is a clock signal from a clock circuit.

29. A method according to claim 18 wherein the clock signal is produced by a processor.

30. A method according to claim 18 wherein the clock signal is produced by a clock circuit.

31. The method of claim 18 further comprising accessing one of the plurality of memory banks by a processor when the one of the plurality of memory banks is being driven with selected individual clock edges.

* * * * *